(12) United States Patent
Brisbin et al.

(10) Patent No.: US 6,727,547 B1
(45) Date of Patent: Apr. 27, 2004

(54) METHOD AND DEVICE FOR IMPROVING HOT CARRIER RELIABILITY OF AN LDMOS TRANSISTOR USING DRAIN RING OVER-DRIVE BIAS

(75) Inventors: Douglas Brisbin, San Jose, CA (US); Andy Strachan, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/266,543

(22) Filed: Oct. 8, 2002

(51) Int. Cl.[7] .............................................. H01L 29/78
(52) U.S. Cl. ...................................................... 257/335
(58) Field of Search ................................ 257/335, 336, 257/337, 338, 339, 340, 341, 342, 343, 344, 345, 346

(56) References Cited

U.S. PATENT DOCUMENTS 5,910,677 A * 6/1999 Irino
6,169,309 B1 * 1/2001 Teggatz et al.

* cited by examiner

*Primary Examiner*—Nathan J. Flynn
*Assistant Examiner*—Kevin Quinto
(74) *Attorney, Agent, or Firm*—Jurgen Vollrath

(57) ABSTRACT

In a LDMOS transistor or matrix of transistors, hot carrier degradation effects are reduced by providing a ring drain and providing the ring drain with an overvoltage bias relative to the internal drain(s) of the LDMOS transistors.

8 Claims, 5 Drawing Sheets

METHOD AND DEVICE FOR IMPROVING HOT CARRIER RELIABILITY OF AN LDMOS TRANSISTOR USING DRAIN RING OVER-DRIVE BIAS

FIELD OF THE INVENTION

The invention relates to semiconductor devices, and particular LDMOS transistors, and defines a method and device for improving hot carrier reliability.

BACKGROUND OF THE INVENTION

In high voltage smart power (20–30V) applications, n-channel lateral DMOS (N-LDMOS) have commonly been used as driver transistors. Typically smart power management devices, as found in voltage converters, mobile phones, internet appliances, etc., combine high performance CMOS or bipolar transistors with a power MOS driver. As mentioned above, the power transistor commonly comprises an LDMOS device.

One of the problems created by the high drain voltages of the LDMOS drivers, however, is the potential for hot carrier degradation. In order to achieve high drive currents and minimal on-resistance LDMOS devices are often implemented in a checkerboard array of transistors, as shown in FIG. 1. These comprise an array of transistors in which the drains 100 and sources 102 are connected by metal routing ties or connectors 104, as shown, to define parallel sets of transistors that are controlled together to handle the high currents. A separate connection (not shown) is provided for the polysilicon gate, in order to control the resistance of the device. The effect of the array is to be able to handle high currents, reduce power dissipation, and provide for more uniform current flow per device area.

At high drain-source voltage (VDS) and high gate-source voltage (VGS), LDMOS devices, however, display destructive snapback due to the intrinsic parasitic NPN bipolar transistor. This raises hot carrier degradation concerns and limits the operating envelope and hot carrier (HC) stress bias condition to an electrically safe operating area (SOA).

One approach proposed by the present applicants in an earlier application, entitled "STRUCTURE AND METHOD FOR IMPROVING LDMOS TRANSISTOR HOT CARRIER RELIABILITY USING A DRAIN RING" to address hot carrier concerns, is to introduce a drain ring to redistribute internal array current flow. Simulations have shown that such a drain ring sinks more current than would be expected from geometric considerations, because of reduced current crowding at the drain ring. Furthermore the electric field is less at the edge of the array than at any of the center cells. This leads to less impact ionization at the drain edge and less on-resistance shift due to hot carrier degradation.

Nevertheless degradation due to hot carrier effects takes place over time due to the cumulative nature of hot carrier degradation. It is therefore desirable to find ways of further reducing hot carrier degradation.

SUMMARY OF THE INVENTION

The present invention provides a method and structure for reducing hot carrier degradation by providing a LDMOS array with a drain ring and providing the drain ring with a separate bias that is higher than that of the internal array drains.

According to the invention, there is provided a method of reducing hot-carrier degradation in a LDMOS array of at least one LDMOS transistor, each LDMOS transistor having an internal drain and source, comprising providing a drain ring for the array, and biasing the drain ring at a higher voltage than the at least one internal drain. Preferably the array includes a plurality of transistors with internal drains connected together and internal sources connected together. The drain ring may be biased at a voltage that is approximately 5V higher than the bias voltage on the internal drains.

Further, according to the invention, there is provided a method of adjusting the hot carrier degradation of a LDMOS device, comprising providing a drain ring that extends at least partly around the internal drain and source of the LDMOS device, and varying the voltage differential between the voltage to the internal drain of the LDMOS device and the voltage to the drain ring. Preferably the drain ring is biased at a higher voltage than the internal drain. The method may further comprise providing a plurality of LDMOS devices within the drain ring, wherein the internal drains are connected together and the internal sources are connected together.

Still further, according to the invention there is provided an array of LDMOS devices, with a drain ring extending at least partially around the LDMOS devices, wherein the drain ring is provided with a separate connection. Preferably a higher voltage is applied to the drain ring than to internal drains of the LDMOS devices of the array.

DETAILED DESCRIPTION OF THE INVENTION

Figure 1:
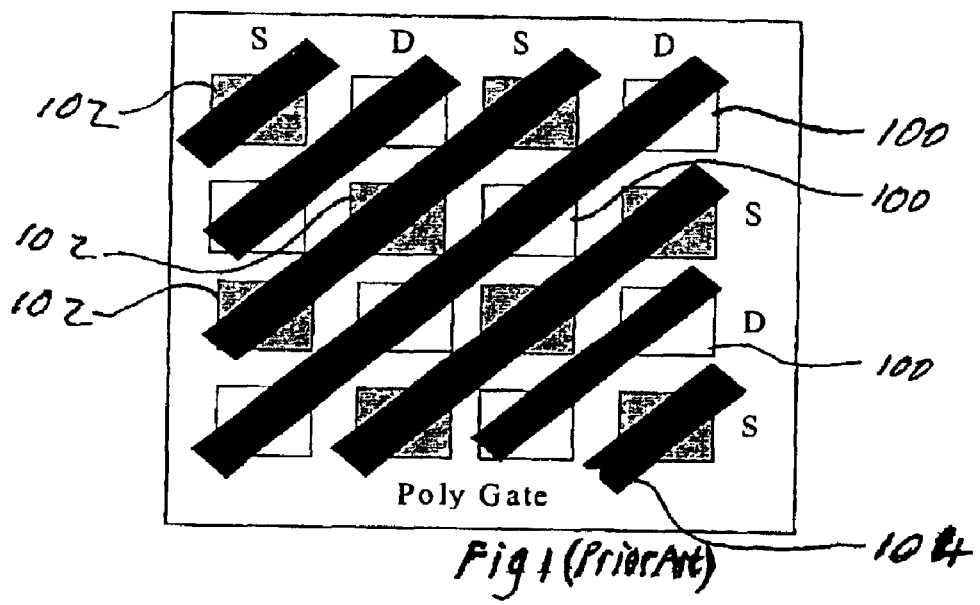
FIG. 1 is shows the layout of a typical prior art LDMOS array.
Figure 2:
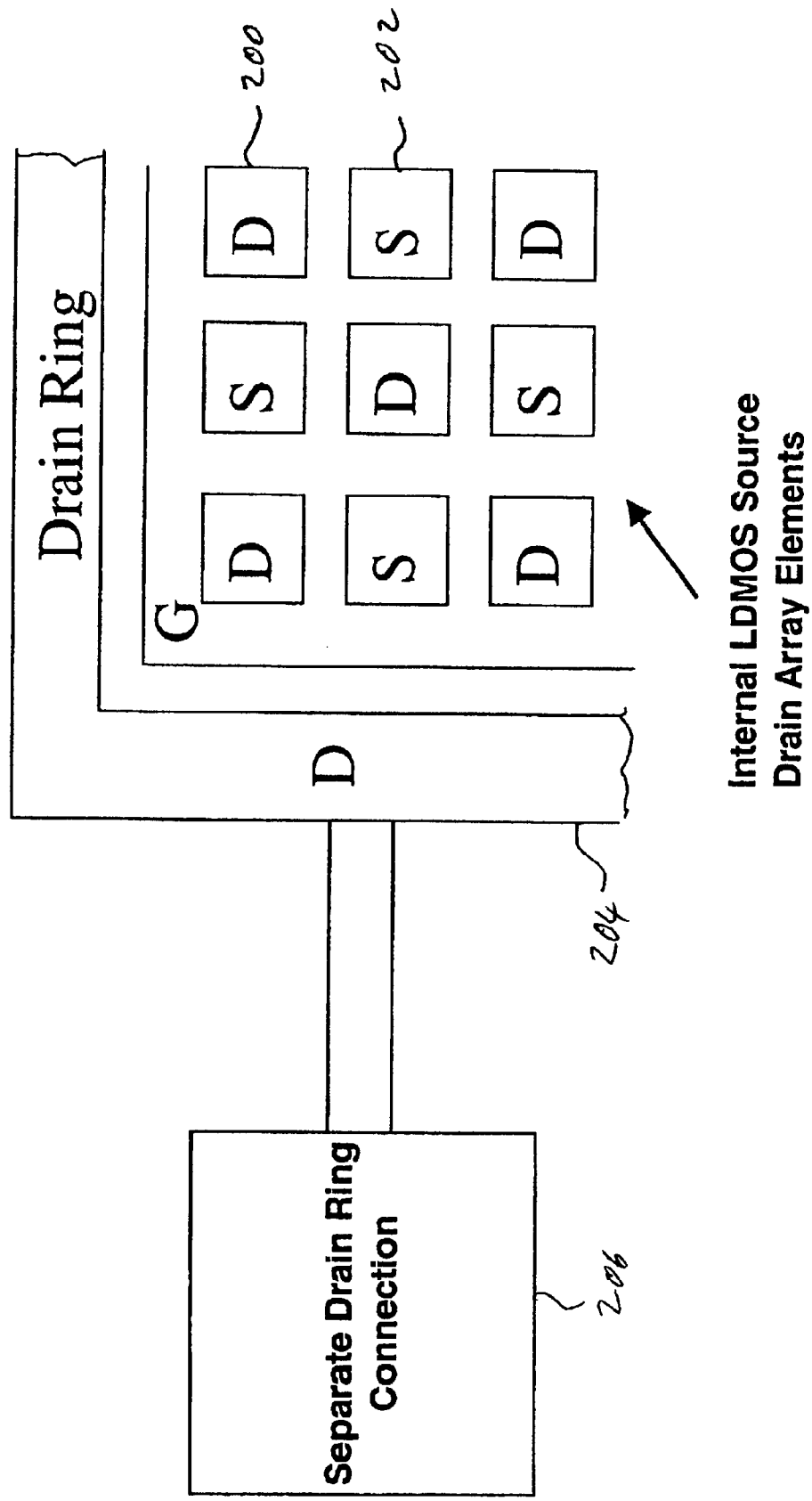
FIG. 2 shows part of an array structure in accordance with the invention.

One embodiment of the invention is shown in FIG. 2. The structure of FIG. 2 shows part of a matrix of LDMOS transistors comprising a plurality of LDMOS transistors that each includes a drain 200 and a source 202. The drains 200 and sources 202 will be referred to as internal drains 200 and internal sources 202 in order to distinguish from the drain ring 204 which is partially shown in FIG. 2. It will be appreciated that the drain ring 204, in one embodiment, can extend all the way around the matrix of transistors, while in another embodiment it may only extend partly around the matrix of transistors. As for the prior art matrix discussed above, the internal drains are connected together and the internal sources are connected together (not shown), for example by means of metal routing ties.

In accordance with the invention, the drain ring 204 is connected to a separate drain ring connector 206 to allow the drain ring to be biased separately from the internal drains 200.

Figure 3:
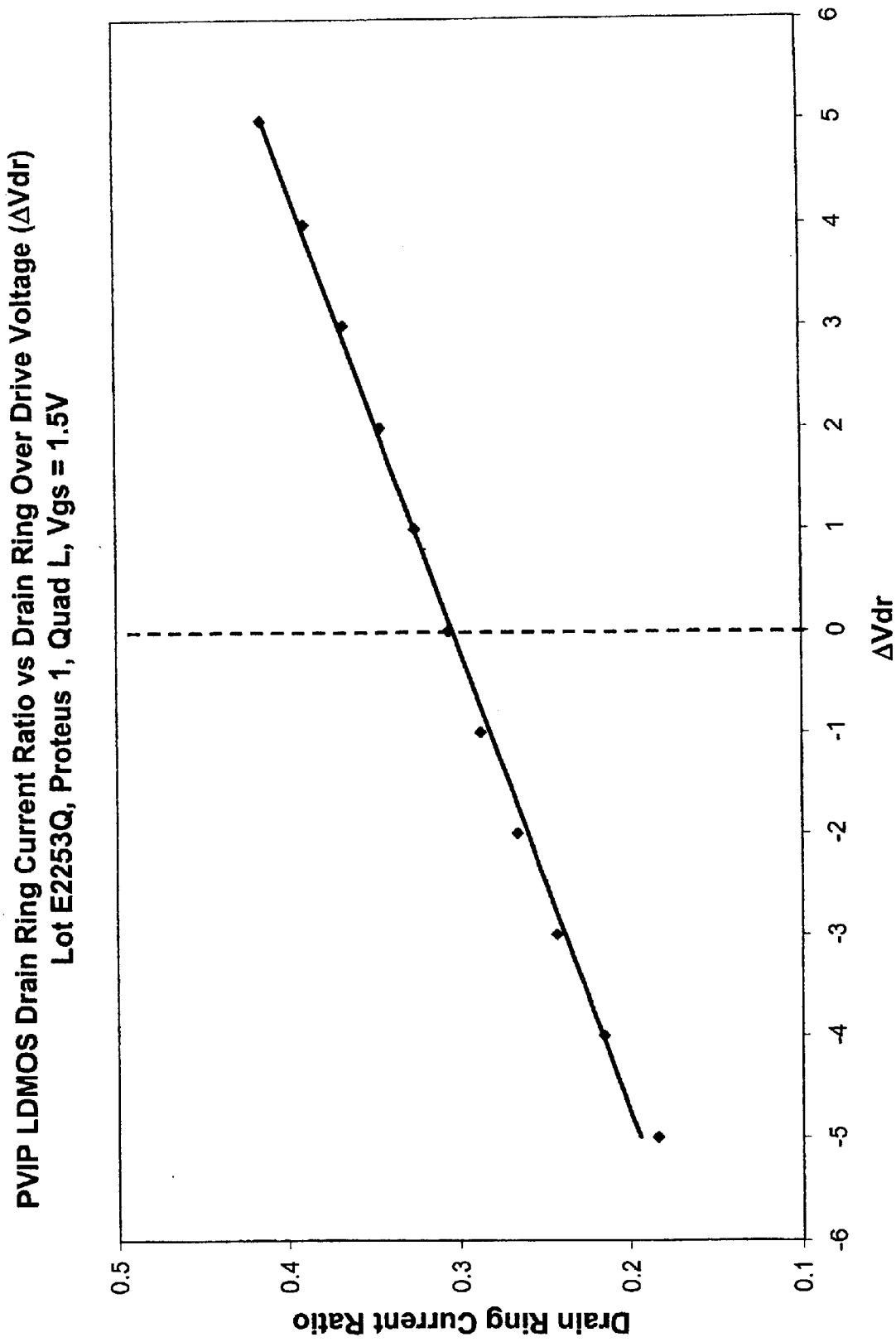
FIG. 3 shows a drain ring current ratio versus drain ring over-drive voltage curve for one embodiment of the invention.

As the differential voltage between the drain ring 204 and internal drains 200 increases, the amount of current flowing to the drain ring 204 relative to the current flowing to the internal drains 200, increases, thereby improving the hot carrier performance of the structure. This is shown for one embodiment by the graph 300 in FIG. 3, in which the increase in relative voltage bias on the drain ring 204 produces an increase in the relative current flowing to the drain ring 204. The plot shown in FIG. 3 is shown for a voltage differential between −5V (internal drain voltage 5V higher than drain ring voltage) and 5V (drain ring voltage 5V higher than internal drain voltage.)

Figure 4:
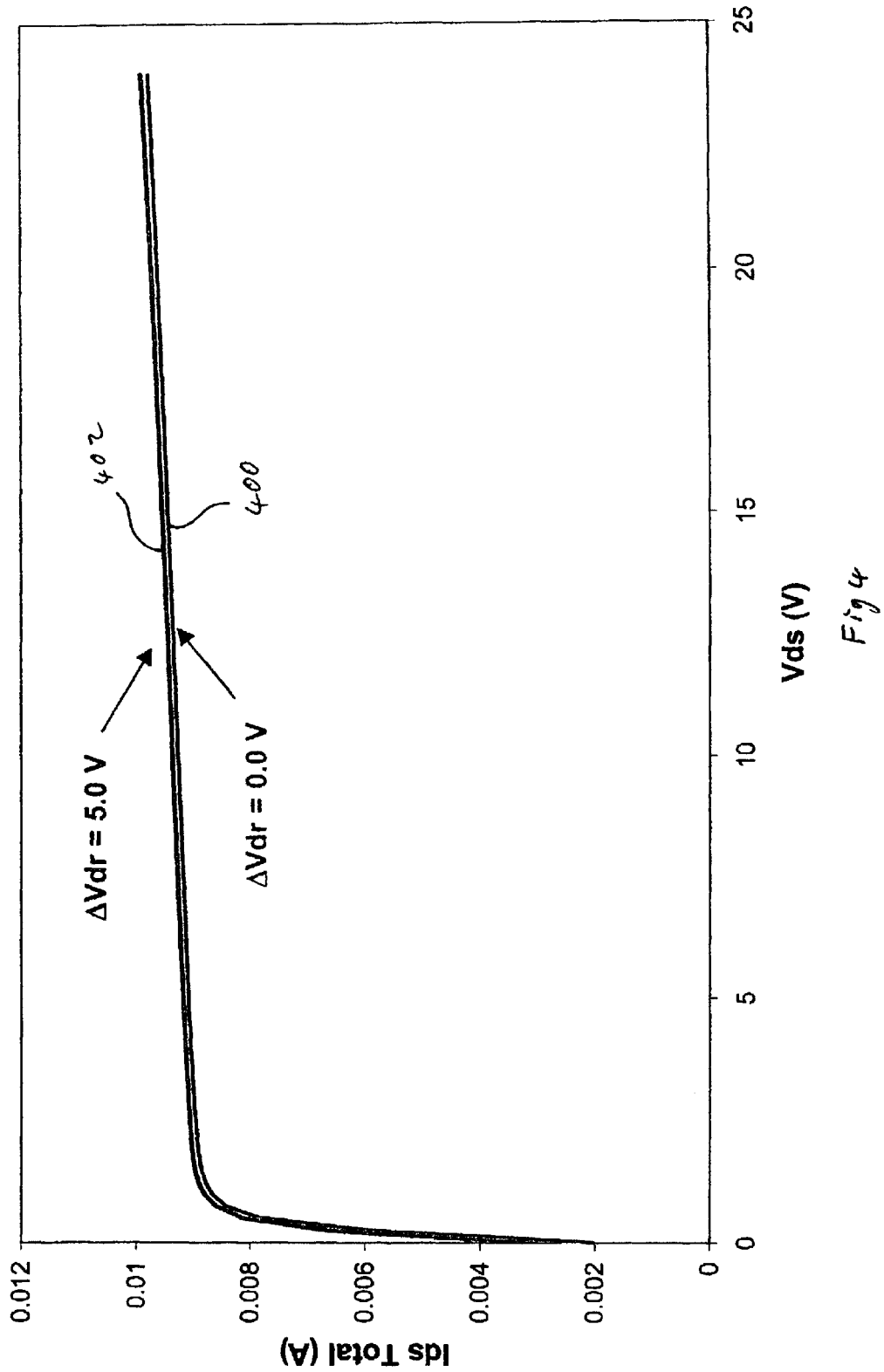
FIG. 4 is a curve showing the effect of drain ring over-drive voltage on total train source voltage for a prior art device and a device of the invention.

Notwithstanding the differential bias, the operation of the structure is not negatively affected. The total drain-source current (current to the local drains and current to the drain ring) remains substantially the same for a differential voltage of 5V between the drain ring and the local drains, as compared to the prior art situation where there is no differential voltage. This is shown by the graphs of FIG. 4 in which total drain-source current versus drain-source voltage curves are shown for a prior art structure (curve 400) and for one embodiment of a structure of the invention in which the voltage differential was 5V (curve 402).

Figure 5:
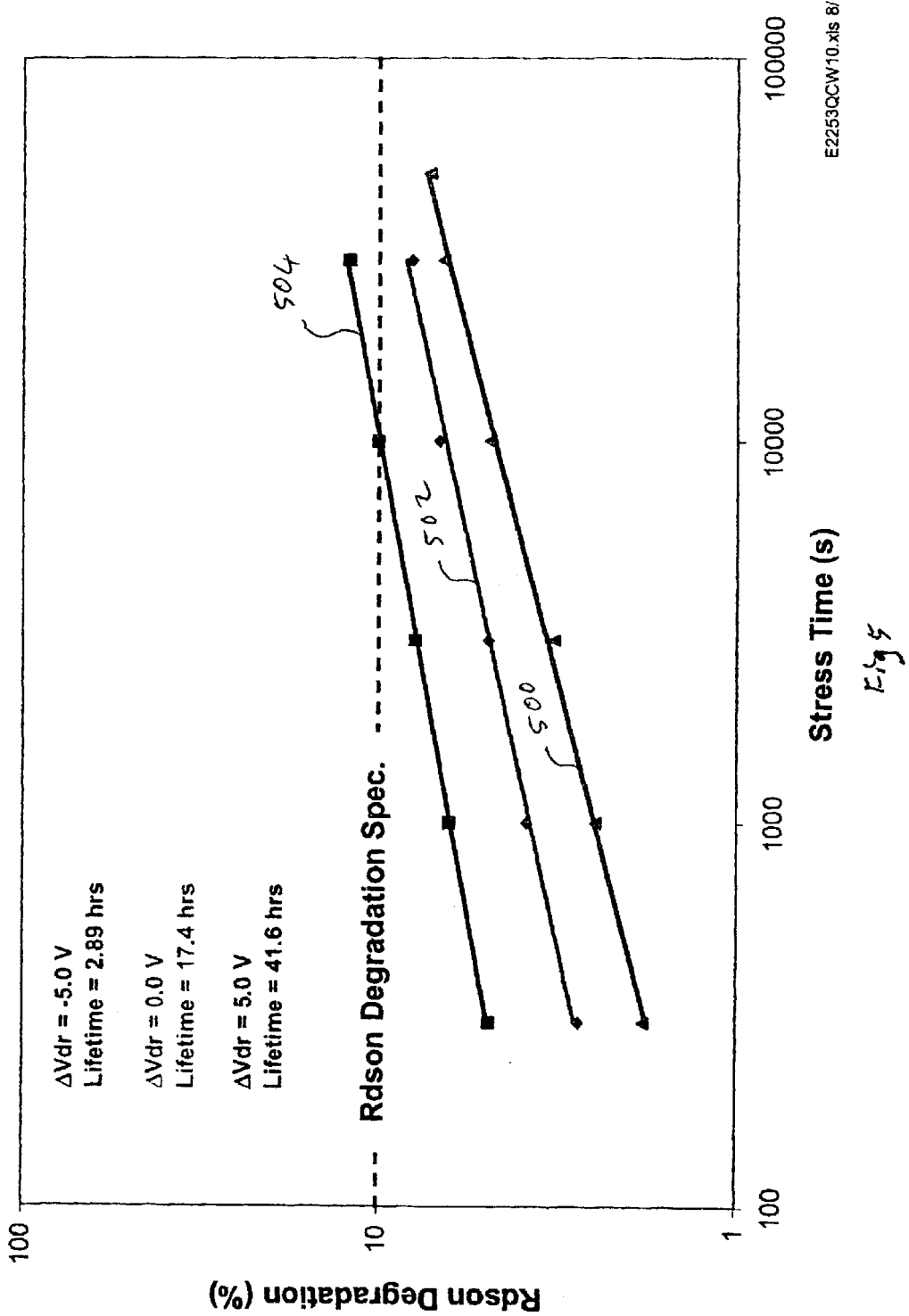
FIG. 5 shows curves showing the effect of drain ring over-drive bias on the on-resistance hot carrier degradation, for different over-voltage values.

The effect of differential biasing becomes particularly clear when considering the graphs of FIG. 5. As mentioned above, LDMOS transistors are typically used at high currents and voltages (e.g., 2 A/mm2, and 24V). Under these conditions hot electron effects occur and cause degradation of a number of device parameters, including threshold voltage, gain and on-resistance. In the case of LDMOS transistors, the parameter that is particularly susceptible to hot carrier degradation is the on-resistance. The time for the on-resistance to shift by a specified amount (e.g., 10%) is defined as the hot electron lifetime of the array. As shown in FIG. 5, for 30V LDMOS technology, the on-resistance shift of 10% is reached at substantially different times depending on the differential voltage level. For a differential voltage of 5V (curve 500), where the drain ring is provided with and over-voltage bias of 5 V over the bias to the internal drains, the 10% shift has not even been reached in the stress time interval shown, and appears will only be reached substantially later than 100,000 seconds stress time. For zero differential voltage, as for a prior art matrix, curve 502 shows that the 10% shift will be reached substantially prior to the 100,000 second stress time. The opposite bias, where the drain ring is biased at 5V below that of the internal drains, produces even worse results, passing the 10% shift mark at about 10,000 seconds (curve 504).

In the embodiment of FIG. 2, an array of a plurality of transistors was shown surrounded by a ring drain. It will be appreciated that the number of transistors may vary and may include only one transistor that would still gain benefit from the redistribution of current due an over-biased ring drain. Thus, while the invention was described for one particular embodiment, it will be appreciated that it has applicability to variations and can be implemented in different ways with different voltage differentials, different numbers of transistors in the matrix, different drain ring configurations, etc., without departing from the invention as defined by the claims.

What is claimed is:

1. A method of reducing hot-carrier degradation in a LDMOS array of at least one LDMOS transistor, each LDMOS transistor having an internal drain and source, comprising providing a drain ring for the array, and biasing the drain ring at a higher voltage than the at least one internal drain.

2. A method of claim 1, wherein the array includes a plurality of transistors with internal drains connected together and internal sources connected together.

3. A method of claim 1, wherein the drain ring is biased at a voltage that is approximately 5V higher than the bias voltage on the at least one internal drain.

4. A method of adjusting the hot carrier degradation of a LDMOS device, comprising providing a drain ring that extends at least partly around the internal drain and source of the LDMOS device, and varying the voltage differential between the voltage to the internal drain of the LDMOS device and the voltage to the drain ring.

5. A method of claim 4, wherein the drain ring is biased at a higher voltage than the internal drain.

6. A method of claim 5, further comprising providing a plurality of LDMOS devices within the drain ring, wherein the internal drains are connected together and the internal sources are connected together.

7. An array of LDMOS devices, with a drain ring extending at least partially around the LDMOS devices, wherein the drain ring is provided with a separate connection.

8. An array of claim 7, wherein a higher voltage is applied to the drain ring than to internal drains of the LDMOS devices of the array.

* * * * *